United States Patent
Lee

(10) Patent No.: US 7,884,618 B2
(45) Date of Patent: Feb. 8, 2011

(54) TESTING SYSTEM FOR ELECTRICITY SAFETY AND A TESTING METHOD THEREFOR

(75) Inventor: Yu-Lung Lee, Nanjhuang Township (TW)

(73) Assignee: Powertech Industrial Co., Ltd., Chung Ho (TW)

( * ) Notice: Subject to any disclaimer, the term of this patent is extended or adjusted under 35 U.S.C. 154(b) by 346 days.

(21) Appl. No.: 12/082,158

(22) Filed: Apr. 9, 2008

(65) Prior Publication Data

US 2009/0174414 A1 Jul. 9, 2009

(30) Foreign Application Priority Data

Jan. 9, 2008 (TW) .............................. 97100836 A

(51) Int. Cl.
*G01R 31/00* (2006.01)
*H02H 3/00* (2006.01)
(52) U.S. Cl. ........................ 324/600; 324/508; 361/79
(58) Field of Classification Search .................. 324/600, 324/713, 66, 424, 158.1, 508–511, 543; 361/42–50, 361/58, 78–79, 86–87, 88, 90, 91.1
See application file for complete search history.

(56) References Cited

U.S. PATENT DOCUMENTS 3,996,168 A * 12/1976 Hoffmann et al. ....... 252/520.21
7,057,401 B2 * 6/2006 Blades ....................... 324/713

* cited by examiner

*Primary Examiner*—Timothy J Dole
*Assistant Examiner*—Farhana Hoque
(74) *Attorney, Agent, or Firm*—C. G. Mersereau; Nikolai & Mersereau, P.A.

(57) ABSTRACT

A system for testing the safety of electricity includes steps as following. First step is inserting a testing apparatus into a socket of utility power. Second step is providing a first amplifier and rectifier unit for measuring a first voltage wave as no-loading. Third step is providing a signal capturing unit at driver circuit for capturing an instant load cycle current wave. Fourth step is providing a second amplifier and rectifier unit for simulating a second voltage wave according to the instant cycle current wave. At least, a processing unit provides for comparing the first voltage wave with the second voltage wave. Therefore, the above-mentioned method is provided for determining the quality of household electricity wire and further improving the electricity safety.

14 Claims, 4 Drawing Sheets

TESTING SYSTEM FOR ELECTRICITY SAFETY AND A TESTING METHOD THEREFOR

BACKGROUND OF THE INVENTION

1. Field of the Invention

The present invention relates to a testing method and system for electricity safety and in particular to a testing method and system for actively determining the quality of a household electricity wire.

2. Description of Prior Art

Electricity is widely used in modern life as much of commonly used equipment is driven by electricity. However, electricity can cause some accidents when not used properly.

Electricity accidents are often caused by overcharges or short circuits. The conductive wire has a limitation of the current, for example, the limitation "125V, 15 A" marked on the wire signifies that the highest voltage for this wire is 125V and the total current flowing in the wire must be smaller than 15 A. If a user uses several pieces of equipment at the same time, the total current is higher than 15 A, i.e. overcharge or overload, and an accident will occur. Excessive heat will be induced on the wire during overloading and the insulating layer coated outside the wire will melt or burn so that a fire accident occurs. Short circuits also occur in the household equipment. Many reasons cause the short circuit situation, for example the conductive wire inside the plug is broken, the isolation of the power fails, or the two electrodes contacts to each other. The instant current is very large when a short circuit happens. The household environment can also influence electricity safety. For example, it is important to keep the electric equipment in sufficient distance from flammables, and the wire should not be pressed by furniture.

For electricity safety, protecting circuits are disposed on household electricity wires such as over-current protection circuits or over-voltage protection circuits. The over current protection circuit can be a fuse made of alloy of Pd, Sn, and Cd metals. The fuse has low melting point so that the fuse is melt because of the heat of high current. The safety fuse can be broken fast so as to protect the equipment from high current.

However, the traditional protection mechanism is a passive protection. In other words, the protection mechanism acts on the critical point of an accident. When accidents occur, users do not have much time to control the situation. Furthermore, the traditional protection mechanism can not determine the danger of the wire in advance.

Therefore, in view of this, the inventor proposes the present invention to overcome the above problems based on his expert experience and deliberate research.

SUMMARY OF THE INVENTION

The primary object of the present invention is provided for a testing system for electricity safety and a testing method thereof. The present invention is applied for actively determining the quality of the household electricity wire in order to prevent houses or people from the danger.

In order to achieve the above object, the present invention provides a testing system for electricity safety comprising: a first amplifier and rectifier unit for measuring a first voltage wave of the household electricity wire when no load is applied, a signal capturing unit, a second amplifier and rectifier unit, and a processing unit. The signal capturing unit has a switching device (for example: an MOSFET device, an IGBT device, a driving switch unit and so on) and a first resistor parallel connected to the switching device. The switching device is used for capturing a current signal of the household electricity wire when loading the first resistor and the current signal of the household electricity wire captured by the signal capturing unit is transformed to a voltage signal by a micro-resistor. The second amplifier and rectifier unit is connected to the capturing unit for transforming the voltage signal to a second voltage wave. The processing unit is connected to the first amplifier and rectifier unit and the second amplifier and rectifier unit for comparing the first voltage wave and the second voltage wave and then outputting a comparison result.

The present invention is provided for measuring the impedance of the household electricity wire in order to determine the quality of the wire. Users can clearly understand the total situation of the household electricity wires of the house so as to take some necessary act in order to improve the safety of house.

In order to better understand the characteristics and technical contents of the present invention, a detailed, description thereof will be made with reference to the accompanying drawings. However, it should be understood that the drawings and the description are illustrative but not used to limit the scope of the present invention.

DETAILED DESCRIPTION OF THE INVENTION

Figure 1:
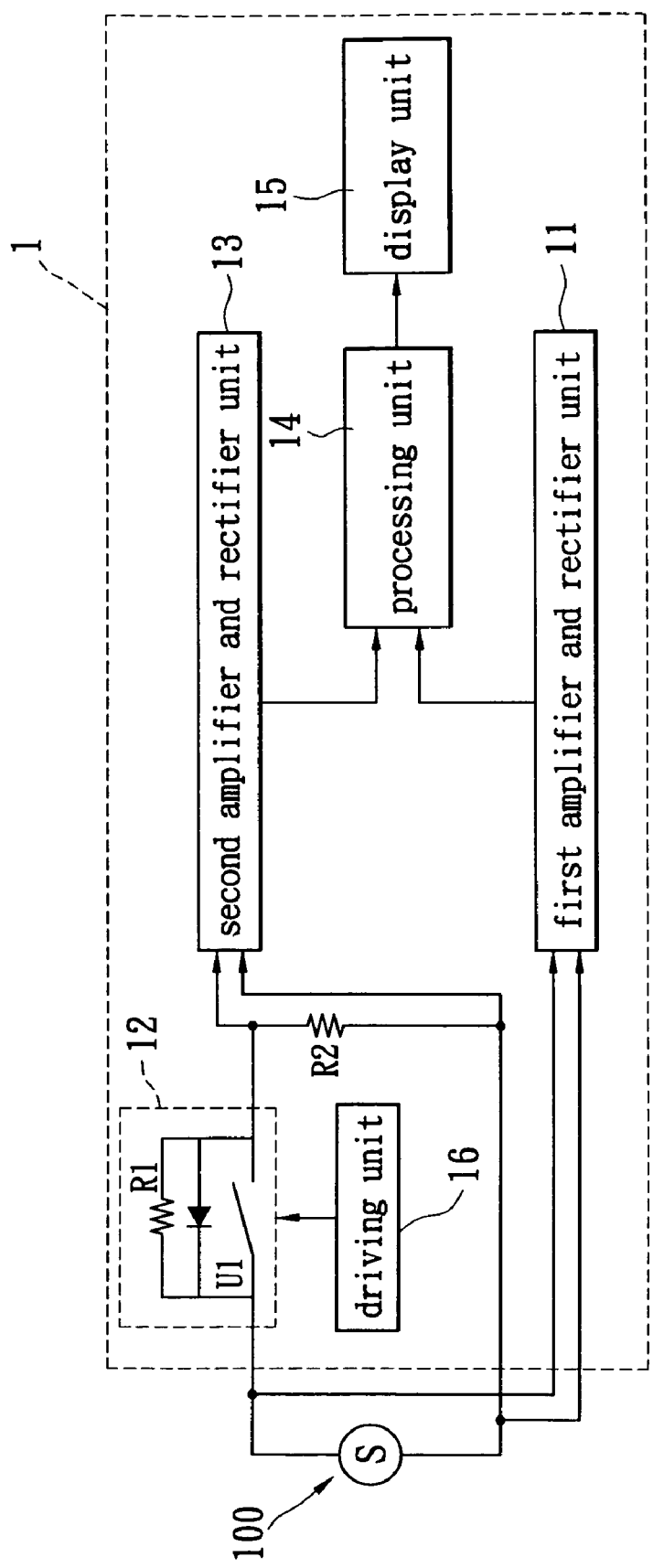
FIG. 1 is a circuit diagram showing the testing system for electricity safety according to the present invention.
Figure 2:
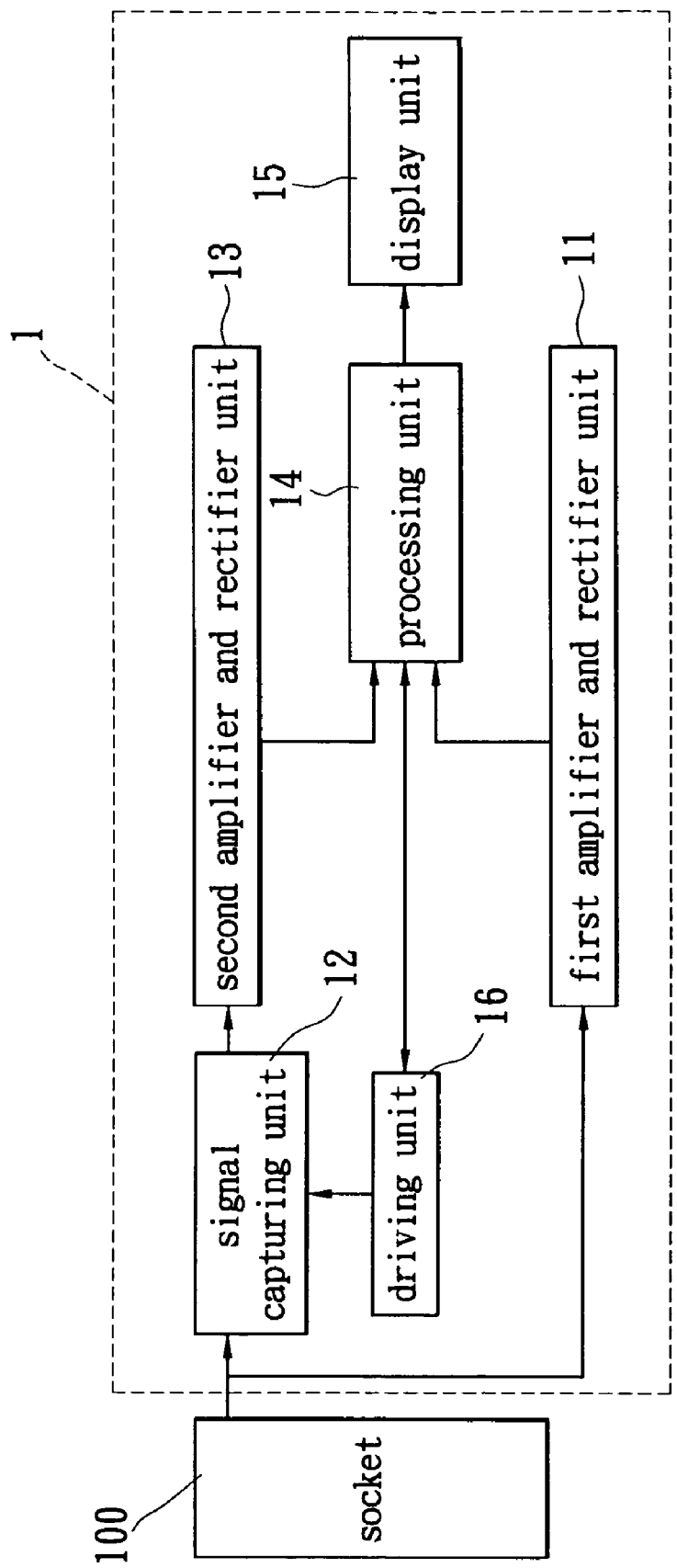
FIG. 2 is a function block diagram showing the testing system for electricity safety according to the present invention.
Figure 3:
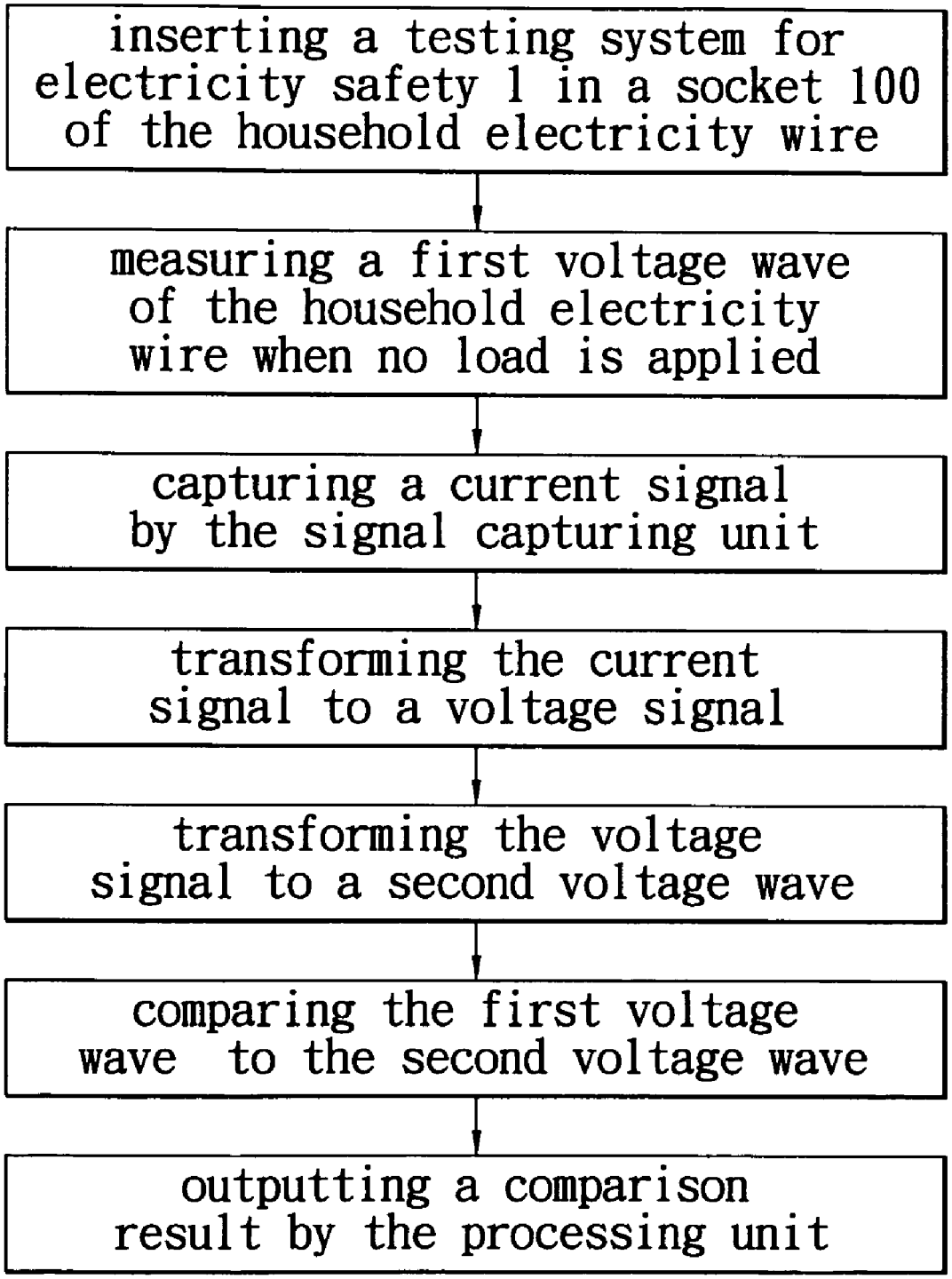
FIG. 3 is a flow chart shows the testing method for electricity safety according to the present invention.

Please refer to FIGS. 1 and 2, the invention discloses a testing system for electricity safety 1 for measuring the impedance of the household electricity wire in order to determine the quality of the wire. The testing system for electricity safety 1 has a plug used for inserting into the socket 100 of the household electricity wire. The testing system for electricity safety 1 comprises a first amplifier and rectifier unit 11 for measuring a first voltage wave "a" of the household electricity wire when no load is applied a signal capturing unit 12, a second amplifier and rectifier unit 13, and a processing unit 14. The signal capturing unit 12 has a switching device U1 (for example: an MOSFET device, an IGBT device, a driving unit and so on) and a first resistor R1. The switching device U1 is used for capturing a current signal of the household electricity wire when loading the first resistor R1 and the current signal of the household electricity wire captured by the signal capturing unit 12 is transformed to a voltage signal by a micro-resistor. The second amplifier and rectifier unit 13 is connected to the signal capturing unit 12 for transforming the voltage signal to a second voltage wave "b". The processing unit 14 is connected to the first amplifier and rectifier unit 11 and the second amplifier and rectifier unit 13 for comparing the first voltage wave "a" and the second voltage wave "b" to output a comparison result. According to the comparison result, a user can determined the quality of the household electricity wire.

In the preferred embodiment, the amplifier and rectifier unit 11 is a differential amplifier and full-wave/half wave rectifier circuit, and the second amplifier and rectifier unit 13 is also a differential amplifier and full-wave/half wave rectifier circuit, but the present invention is not restricted to above-mentioned devices. The signal capturing unit 12 is disposed between the amplifier and rectifier unit 11 and the second amplifier and rectifier unit 13. The amplifier and rectifier unit 11 is used for measuring a first voltage wave "a" of the household electricity wire, and the first voltage wave "a" is an experimental voltage thus the processing unit 14 can calculate the reference impedance in order to judge the quality of conductive wire.

The signal capturing unit 12 includes a switching device U1 and a first resistor R1. The switching device U1, for example but not restricted, is an MOSFET device, an IGBT device, or a driving unit. The switching device U1 is used for capturing a current signal in an instant loading cycle when the first resistor R1 is loaded. In the above circuit, the first resistor R1 is employed for a reference impedance with a good quality of the wire. Furthermore, the current signal of the household electricity wire captured by the signal capturing unit is transformed to a voltage signal by a second resistor R2. The second resistor R2 can be a micro-resistor or a Cu (copper)-Mn (manganese) wire.

On the other hand, the second amplifier and rectifier unit 13 is connected to the signal capturing unit 12 for transforming the voltage signal to a second voltage wave "b". The second amplifier and rectifier unit 13 can be a differential amplifier and full-wave/half wave rectifier circuit. In another words, the voltage (second voltage wave "b") at the loading of first resistor RI is simulated to be a reference voltage presenting the wire is at good situation. Therefore, the difference between the first voltage wave "a" and the second voltage wave "b" is used to determine the quality of the wire. If the difference is located in a predetermined range, the wire is on a good condition.

Figure 4:
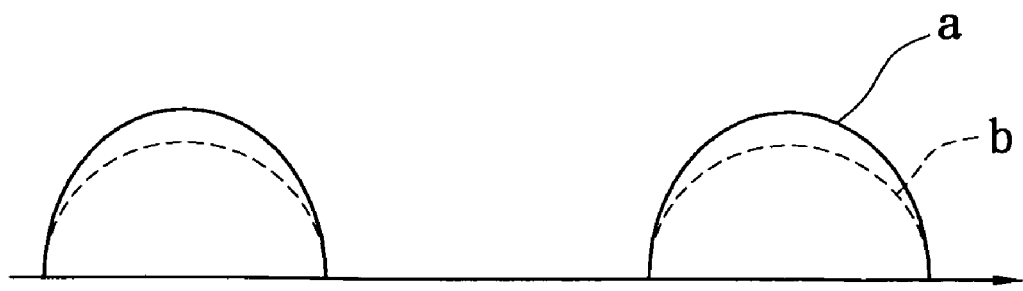
FIGS. 4 to 4B show the compared voltage according to the present invention.
Figure 4A:
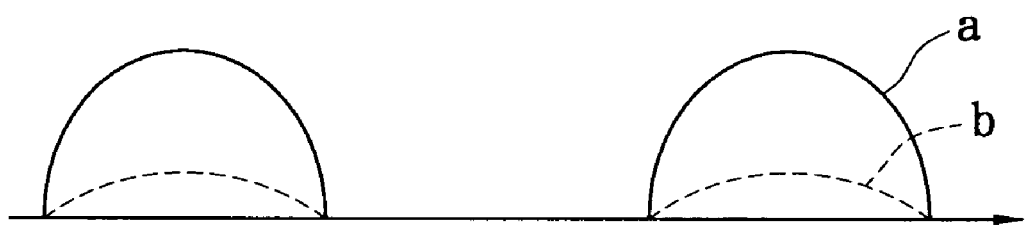
Figure 4B:
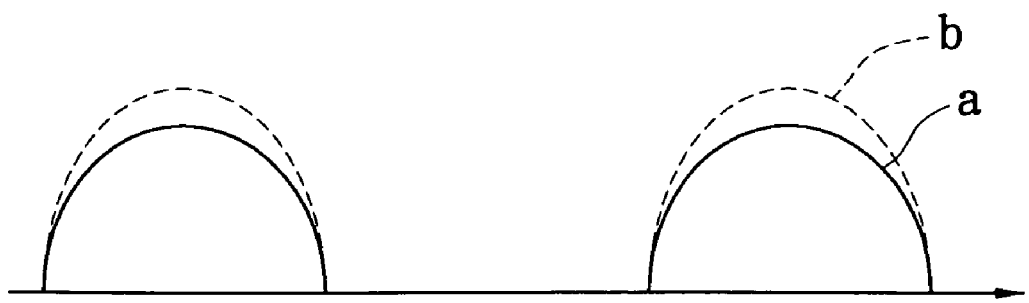

The processing unit 14 is connected to the first amplifier and rectifier unit 11 and the second amplifier and rectifier unit 13 for receiving the first voltage wave "a" and the second voltage wave "b" and further comparing the first voltage wave "a" and the second voltage wave "b" so as to output a comparison result. The processing unit 14 is, but not restricted to, a MCU or an analog comparing circuit. The processing unit 14 samples and compares the two voltages. Please refer to FIG. 4, the figure shows the comparison result in a wave form. In FIG. 4, there is a negative bias between the first voltage wave "a" and the second voltage wave "b" (i.e., the reference voltage wave "b" is smaller than the first voltage wave "a"). Please refer to FIG. 4A, the figure shows the bigger negative bias between the first voltage wave "a" and the second voltage wave "b" than that in FIG. 4. On other hands, there is a positive bias between the first voltage wave "a" and the second voltage wave "b" shown in FIG. 4B. The user can determine the wire condition, for example oxidation or crack on the wire body according to the bias (positive or negative), or the difference value between the first voltage wave "a" and the second voltage wave "b".

Moreover, the processing unit 14 is connected to a driving unit 16 therefore the processing unit 14 can drive the signal capturing unit 12 to capture the current signal via the driving unit 16.

Additionally, the testing system for electricity safety 1 further comprises a display unit 15 for receiving and then showing the comparison result. In an embodiment, the display unit 15 has a plurality of indicating light sources with different colors and the indicating light sources are respectively turned on depending on the different comparison results. For example, the difference between the first voltage wave "a" and the second voltage wave "b" is in an "accepted range" (shown in FIG. 4) and the green light source of the display unit 15 is turned on to indicate the condition of the household electricity line. If the difference out of the "accepted range" (shown in FIG. 4A), the red light source of the display unit 15 is turned on to warn the user that there may some defects on the wire. Alternatively, the display unit 15 can be a LCD display and the processing unit 14 can transform the comparison results with wave form into a real impedance values according a comparing table and then output the real impedance value on the LCD display. The user can directly read the impedance of the household electricity wire and further realize the condition of the wire.

A testing method using the testing system for electricity safety 1 is further disclosed. The testing method includes:

step 1: inserting a testing system for electricity safety 1 in a socket 100 of the household electricity wire. The testing system for electricity safety 1 comprises a first amplifier and rectifier unit 11, a signal capturing unit 12, a second amplifier and rectifier unit 13, and a processing unit 14. Furthermore, The testing system for electricity safety 1 has a display unit 15 and a driving unit 16.

step 2: measuring a first voltage wave "a" of the household electricity wire by the first amplifier and rectifier unit 11 when no load is applied.

step 3: capturing a current signal by the signal capturing unit 12. In the step, the processing unit 14 can drive the signal capturing unit 12 to capture the instant current signal via the driving unit 16.

step 4: transforming the current signal to a voltage signal by a micro-resistor and transforming the voltage signal to a second voltage wave "b" by the second amplifier and rectifier unit 13.

step 5: comparing the first voltage wave "a" and the second voltage wave "b" and outputting a comparison result by the processing unit 14. The comparison result is further displayed on the display unit 15 (shown in FIGS. 4-4B).

Furthermore, in order to clearly show the result of the testing method disclosed in this invention, the display unit 15 can have various display means.

To sum up, the present invention achieves the following advantages:

1. In accordance with the present invention, the improved safety is achieved. The testing system for electricity safety 1 is used for directly and actively determining the impedance of the distribution wire and presenting the result clearly so that the user can clearly realize the quality of the wire.
2. The present invention is used for determining the wire quality in advance so as to improve the electricity safety.

Although the present invention has been described with reference to the foregoing preferred embodiment, it will be understood that the invention is not limited to the details thereof. Various equivalent variations and modifications may occur to those skilled in this art in view of the teachings of the present invention. Thus, all such variations and equivalent modifications are also embraced within the scope of the invention as defined in the appended claims.

What is claimed is:

1. A testing method for electricity safety applied for measuring an impedance of a household electricity wire, the testing method comprising:

step 1: inserting a testing system into a socket of the household electricity wire, wherein the testing system comprises a signal capturing unit, a first amplifier and rectifier unit, a second amplifier and rectifier unit, and a processing unit, the signal capturing unit being connected between the first amplifier and rectifier unit and the second amplifier and rectifier unit, the processing unit being connected to the first amplifier and rectifier unit and to the second amplifier and rectifier unit;

step 2: measuring a first voltage wave of the household electricity wire by the first amplifier and rectifier unit when no load is applied;

step 3: capturing a current signal by the signal capturing unit;

step 4: transforming the current signal to a voltage signal by a micro-resistor and transforming the voltage signal to a second voltage wave by the second amplifier and rectifier unit; and step 5: comparing the first voltage wave to the second-voltage wave and outputting the comparison result through the processing unit.

2. The testing method according to claim 1, wherein the signal capturing unit includes a switching device and a first resistor, and the switching device is used for capturing the current signal, of the household electricity wire when loading the first resistor.

3. The testing method according to claim 2, wherein the switching device captures the current signal during a predetermined time period.

4. The testing method according to claim 1, wherein the testing system further comprises a display unit.

5. The testing method according to claim 4, further comprising a display step for presenting the comparison result on the display unit.

6. The testing method according to claim 5, wherein the display unit has a plurality of indicating light sources with different colors, and the indicating light sources are turned on depending on the different comparison results in the display step.

7. The testing method according to claim 5, wherein the comparison result is converted into an impedance value by the processing unit according to a conversion table, and the impedance value is displayed on the display unit.

8. A testing system for electricity safety inserted into a socket of a household electricity wire for measuring the impedance of the household electricity wire, the testing system comprising:

a first amplifier and rectifier unit for measuring a first voltage wave of the household electricity wire when no load is applied;

a signal capturing unit having:

a switching device; and a first resistor;

wherein the switching device is used for capturing a current signal of the household electricity wire when loading the first resistor;

a second amplifier and rectifier unit connected to the signal capturing unit, the signal capturing unit being connected between the first amplifier and rectifier unit and the second amplifier and rectifier unit, wherein the current signal of the household electricity wire captured by the signal capturing unit is transformed to a voltage signal by a micro-resistor and the voltage signal is transformed to a second voltage wave by the second amplifier and rectifier unit; and a processing unit for comparing the first voltage wave to the second voltage wave and to output a comparison result.

9. The testing system according to claim 8, wherein the first amplifier and rectifier unit is a differential amplifier and full-wave/half wave rectifier circuit.

10. The testing system according to claim 9, wherein the micro-resistor is a wire made of copper (Cu)-manganese (Mn) alloy.

11. The testing system according to claim 8, wherein the second amplifier and rectifier unit is a differential amplifier and full-wave/half wave rectifier circuit.

12. The testing system according to claim 8, further comprising a display unit for presenting the comparison result thereon.

13. The testing system according to claim 12, wherein the display unit has a plurality of indicating light sources with different colors, the indicating light sources are lightened depending on the different comparison results.

14. The testing system according to claim 12, wherein the comparison result is converted into an impedance value according to a conversion table by the processing unit and the impedance value is displayed on the display unit.

* * * * *